(12) United States Patent
Nishi

(10) Patent No.: US 8,250,430 B2
(45) Date of Patent: Aug. 21, 2012

(54) CODING SYSTEM, ENCODING APPARATUS AND DECODING APPARATUS, WITH INFORMATION AND PARITY STORAGE UNITS

(75) Inventor: Takashi Nishi, Osaka (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 551 days.

(21) Appl. No.: 12/457,017

(22) Filed: May 29, 2009

(65) Prior Publication Data

US 2010/0050050 A1 Feb. 25, 2010

(30) Foreign Application Priority Data

Aug. 20, 2008 (JP) ................. 2008-212022

(51) Int. Cl.
*H03M 13/00* (2006.01)
(52) U.S. Cl. ........ 714/755; 714/758; 714/781; 714/801; 714/803
(58) Field of Classification Search .................. 714/755, 714/758, 781, 801, 803
See application file for complete search history.

(56) References Cited

U.S. PATENT DOCUMENTS

| | | | | |
|---|---|---|---|---|
| 5,220,568 A * | 6/1993 | Howe et al. | ................... | 714/782 |
| 6,460,154 B1 * | 10/2002 | Duxbury | ..................... | 714/751 |
| 7,000,174 B2 * | 2/2006 | Mantha et al. | ................. | 714/790 |
| 7,155,655 B2 * | 12/2006 | Cheng | ........................... | 714/748 |
| 7,248,188 B2 * | 7/2007 | Ito et al. | ........................ | 341/58 |
| 7,409,622 B1 * | 8/2008 | Lu et al. | ........................ | 714/755 |
| 7,555,269 B2 * | 6/2009 | Tamaki et al. | ................ | 455/102 |
| 7,793,189 B2 * | 9/2010 | Yano et al. | ..................... | 714/748 |

FOREIGN PATENT DOCUMENTS

| | | |
|---|---|---|
| JP | 2004-513532 A | 4/2004 |
| JP | 2007-013863 A | 1/2007 |
| JP | 2007-081931 A | 3/2007 |
| JP | 2008-103991 A | 5/2008 |

OTHER PUBLICATIONS

Aaron, Anne et al., "Transform-domain Wyner-Ziv Codec for Video", Proc. SPIE Visual Communications and Image Processing, San Jose California, 2004.
Sklar, Bernard, "Digital Communications: Fundamentals and Applications", Prentice Hall, 2001, pp. 498-509.
Viterbi, Andrew J., "An Intuitive Justification and a Simpified Implementation of the MAP Decoder for Convolutional Codes", IEEE Journal on Selected Areas in Conmmunications, vol. 16, No. 2, Feb. 1998.

\* cited by examiner

*Primary Examiner* — Esaw Abraham
(74) *Attorney, Agent, or Firm* — Rabin & Berdo, P.C.

(57) ABSTRACT

An encoding apparatus includes a systematic encoder that generates information bits and parity bits, both of which are transmitted selectively to a decoding apparatus. At certain points, sufficient bit data are transmitted to identify the state of the systematic encoder. The decoding apparatus partitions the received bits at these identifiable points, and processes each partition separately by predicting the information bits, modifying the predicted information bits according to the received information bits, and using the parity bits to correct errors in the resulting information bits. In video coding, this partitioning scheme can deal flexibly with multiple image formats without requiring extra decoding circuitry. With a parallel decoding apparatus, the number of decoding units operating concurrently can be changed flexibly. The error correcting capability of the decoding apparatus is also improved.

19 Claims, 13 Drawing Sheets

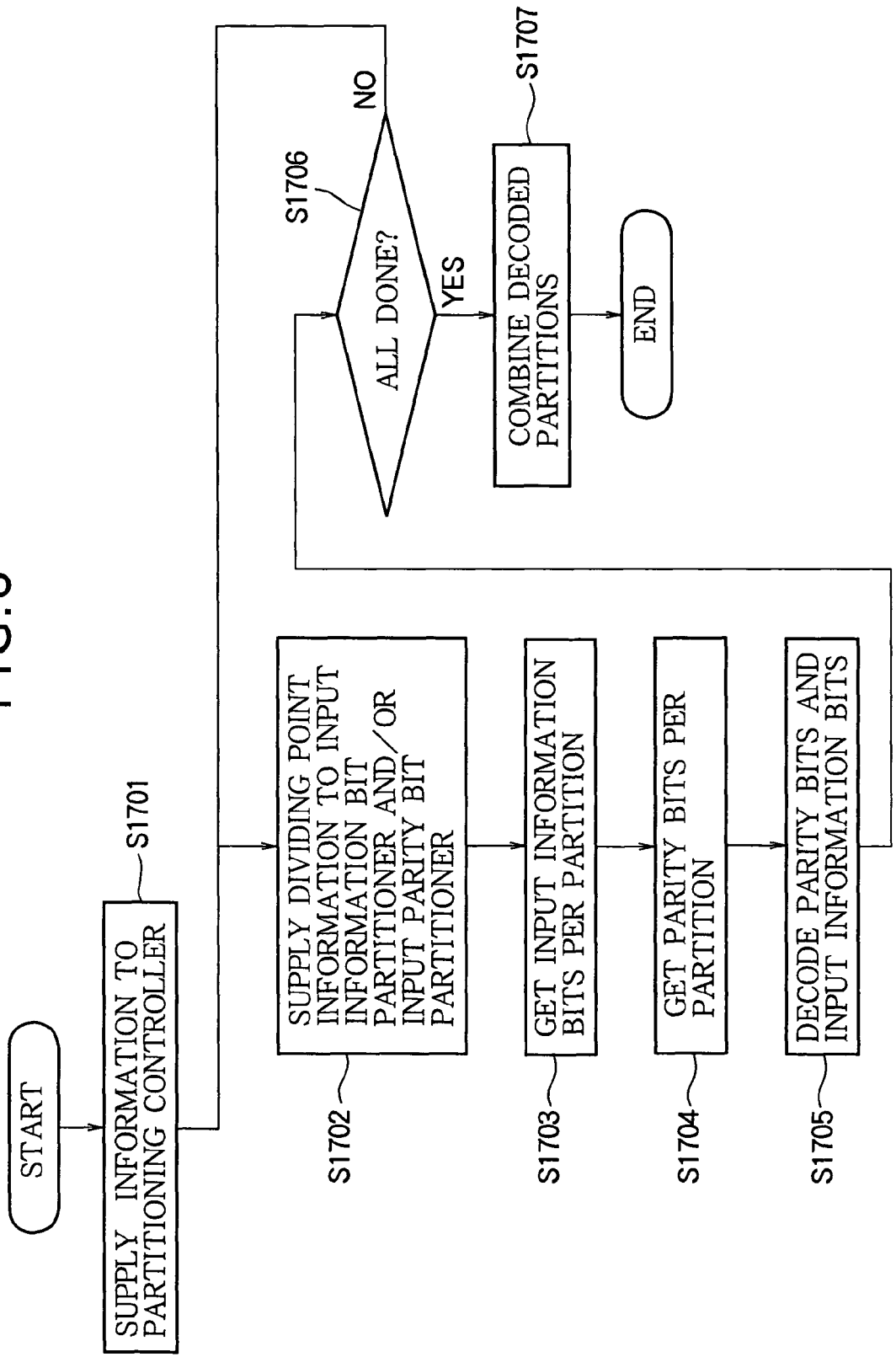

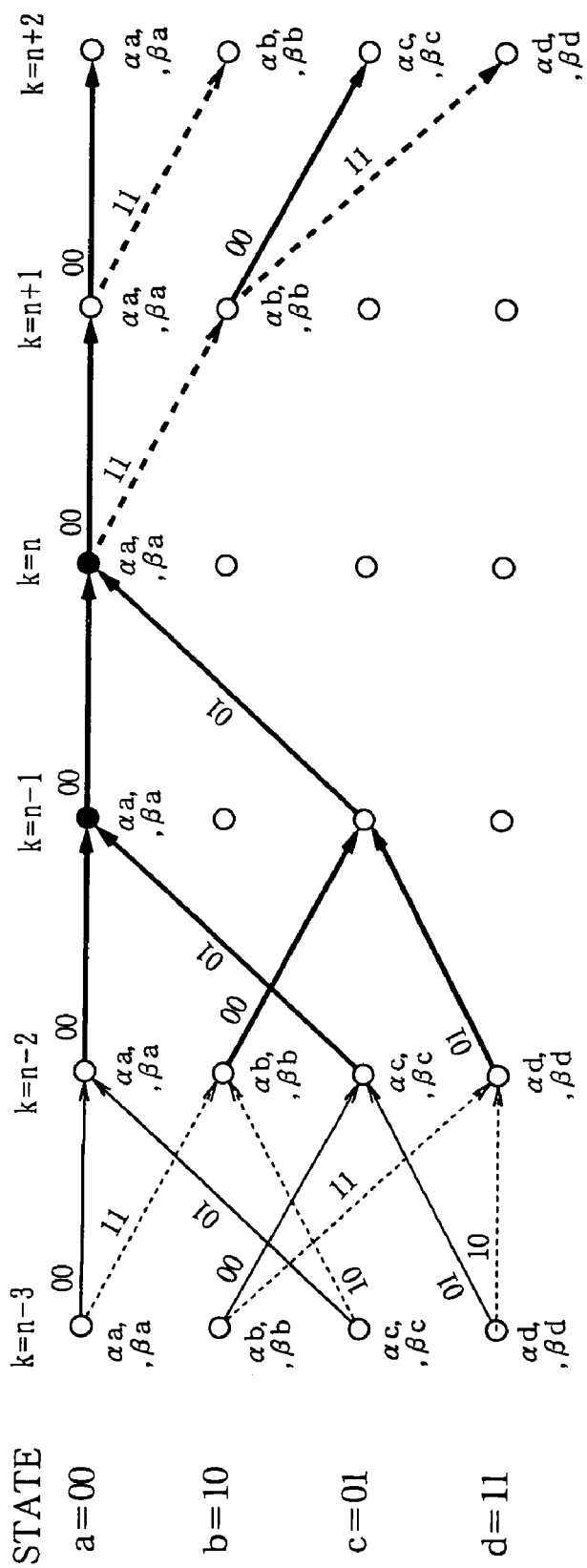

CODING SYSTEM, ENCODING APPARATUS AND DECODING APPARATUS, WITH INFORMATION AND PARITY STORAGE UNITS

BACKGROUND OF THE INVENTION

1. Field of the Invention

The present invention relates to a coding system such as a Slepian-Wolf coding system for use in, for example, distributed video coding, and to the encoding apparatus and decoding apparatus in the coding system.

2. Description of the Related Art

Distributed video coding (DVC) is a video compression method that has grown out of theoretical research by Slepian and Wolf and further work by Wyner, Ziv, and others. In one DVC method, the encoder carries out only intraframe coding, while the decoder carries out both intraframe and interframe decoding. This scheme greatly reduces the computational load on the encoder, for which reason distributed video coding has been attracting considerable attention.

An exemplary distributed coding system is outlined in FIG. 1, which is taken from Aaron et al., 'Transform-Domain Wyner-Ziv Codec for Video', *Proc. SPIE Visual Communications and Image Processing*, San Jose, Calif., 2004. In the encoder, a video image sequence is divided into key frames, to which conventional intraframe coding and decoding are applied, and so-called Wyner-Ziv frames, to which Slepian-Wolf coding and decoding processes are applied. In the encoding process, a discrete cosine transform (DCT) is used to transform each Wyner-Ziv frame to the coefficient domain, the coefficients are grouped into bands, the coefficients in the k-th band are quantized by a $2^{M_k}$-level quantizer, the quantized coefficients ($q_k$) are expressed in fixed numbers of bits, and the bit planes are extracted and supplied to a turbo encoder that that produces information bits and error-correcting bits, called parity bits. The parity bits are stored in a buffer for transmission to the decoder. The information bits are conventionally discarded.

To decode a Wyner-Ziv frame, the decoder generates a predicted image by interpolation or extrapolation from one or more key frames, applies a DCT to convert the predicted image to the coefficient domain, groups the coefficients into bands, and inputs the coefficients in each band as side information to a turbo decoder. The turbo decoder requests the parity bits it needs to detect and correct errors in the side information. If necessary, further parity bits can be requested and the decoding process can be repeated until a satisfactory result is obtained. Alternatively, the transmission of parity bits may be controlled at the coder.

Finally, the decoded values and the side information are both used to reconstruct the coefficients of the Wyner-Ziv frame, and an inverse discrete cosine transform (IDCT) is carried out to recover the image.

FIG. 2 further illustrates the conventional Slepian-Wolf encoding and decoding processes in a slightly different form. The systematic encoder 11 in the encoding apparatus 10A may be any type of encoder that generates information bits and parity bits separately. A turbo encoder is one type of systematic encoder. The information bits are discarded; the parity bits are stored in a parity bit buffer 12. Some or all of the parity bits are sent to a parity bit transmitter 13 and transmitted to the decoding apparatus 10B at the command of a parity bit transmission controller 14.

In the decoding apparatus 10B, the transmitted parity bits are received by a parity bit receiver 15 and placed in a parity bit buffer 16, from which they are supplied to an error correcting decoder 17. An information bit predictor 18 supplies predicted information bits to the error correcting decoder 17. The error correcting decoder 17 uses the parity bits to carry out an error-correcting decoding process and outputs the resulting decoded bits.

The error correcting decoder 17 may use the maximum a-posteriori probability (MAP) decoding algorithm described by Sklar in *Digital Communication: Fundamentals and Applications*, Prentice-Hall, 2001. This algorithm, which is used in turbo coding and other coding methods, is a high-performance error-correcting decoding method in which the coder uses the parity bits and predicted information bits, which are predicted at the decoder, to calculate the probability that each information bit is 0 or 1.

The conventional coding and decoding operations are illustrated in FIGS. 3 and 4. The exemplary systematic encoder 11, represented schematically in FIG. 3, is a feedforward convolutional encoder with a constraint length of three and a coding rate of one-half that generates information bits (x) and parity bits (y). The corresponding decoding operation can be represented in a trellis diagram as in FIG. 4 with forward branch metric values $\alpha$ and backward branch metric values $\beta$.

The forward branch metric values $\alpha$ are calculated from left to right in FIG. 4. At an arbitrary time k, the encoder may be in one of four states (a, b, c, d) representing the two most recent input data bits. The forward branch metric for state a at time k=n, for example, is calculated from the probability that the xy bit values in FIG. 3 at time k=n were 00 and the value of $\alpha$ at state a at time k=n−1, and the probability that the xy bit values at time k=n were 01 and the value of $\alpha$ at state c at time k=n−1. The forward branch metrics for the other states (b, c, d) at time k=n, the branch metrics at time k=n+1, and so on are calculated similarly. These calculations proceed in sequence from left to right.

The backward branch metric values $\beta$ are calculated from right to left in FIG. 4. The backward branch metric for state a at time k=n+1, for example, is calculated from the probability that the xy bit values at time k=n+1 were 00 and the value of $\beta$ at state a at time k=n+2, and the probability that the xy bit values at time k=n+1 were 11 and the value of $\beta$ at state b at time k=n+2. The backward branch metrics for the other states (b, c, d) at time k=n+1, the branch metrics at time k=n, and so on are calculated similarly. These calculations proceed in sequence from right to left.

After $\alpha$ and $\beta$ have been obtained for all states (a, b, c, d) at all times k, these values are used for decoding as described by Sklar.

Since the MAP decoding method proceeds by calculating forward and backward branch metrics as above, its implementation requires that a known number of symbols be processed. In conventional implementations the number of symbols is fixed, and the decoder processes that number of symbols as a single independent unit.

In video coding, however, the image format is not fixed: various video formats are in general use, including the common intermediate format (CIF, 352×288 pixels) and the quarter common intermediate format (QCIF, 177×144 pixels). The number of symbols to be decoded in a CIF frame is four times the number of symbols to be decoded in a QCIF frame.

Another cause of changes in the number of symbols is that the decoder may have to switch between pixel-by-pixel processing and processing of eight-by-eight blocks of pixels. The direct current (DC) component of the DCT, for example, comprises a single value for an eight-by-eight pixel block, so even for the same image format, the number of symbols per frame may change at different stages of the decoding process.

It would be possible to design a multi-format MAP decoder with facilities for handling several different data formats with different numbers of symbols, but this scheme would require extra circuitry and would lack flexibility, as it would only be possible to decode data having one of the particular sizes anticipated by the design.

MAP decoders of the type shown by Sklar are often implemented by parallel processing, as disclosed by Viterbi et al. in 'An Intuitive Justification and a Simplified Implementation of the MAP Decoder for Convolutional Codes', *IEEE Journal on Selected Areas in Communications*, Vol. 16, No. 2, February 1998, but it is difficult to change the multiplicity of the parallel processing flexibly, and parallel processing reduces the error-correcting capability of the decoder.

There is a need for an encoder, a decoder, and a coding system that, while avoiding an increase in circuit size, can deal flexibly with different data formats and sizes, can make flexible changes in the multiplicity of parallel processing, and can provide improved error correcting capability.

SUMMARY OF THE INVENTION

The invention provides an encoding apparatus having a systematic encoder that generates information bits representing data input to the encoder, and parity bits providing redundancy for error correction. The encoding apparatus also has an information bit storage unit for storing the generated information bits, a parity bit storage unit for storing the generated parity bits, an information bit transmission controller for controlling selective transmission of the information bits, a parity bit transmission controller for controlling selective transmission of the parity bits, and a bit transmitter for transmitting the information bits and/or the parity bits under control of the information bit transmission controller and/or the parity bit transmission controller.

The invention also provides a decoding apparatus having a bit receiver for receiving the parity bits and information bits transmitted from the encoding apparatus, an information bit storage unit for storing the received information bits, a parity bit storage unit for storing the received parity bits, an information bit predictor for predicting the information bits, an input information generator for generating input information bits by combining the predicted information bits and the received information bits, and an error correcting decoder that partitions the information and parity bits collectively into sets of bits separated by points at which a state can be identified and decodes each such set of bits serially or in parallel, processing each set separately.

The invention further provides a coding system including the above encoding apparatus and the above decoding apparatus.

The transmission of information bits as well as parity bits enables the internal state of the encoder to be positively identified at some points. By partitioning the received bit stream at such points and processing the partitioned sections separately, the error correcting decoder can deal flexibly different data formats and can make flexible use of parallel decoding algorithms, and its error-correcting capability is enhanced.

BRIEF DESCRIPTION OF THE DRAWINGS

In the attached drawings:

FIG. 8 is a flowchart illustrating the operation of the error correcting decoder in the first embodiment;

FIG. 9 shows an exemplary feedforward trellis diagram for the error correcting decoder in the first embodiment;

DETAILED DESCRIPTION OF THE INVENTION

Figure 1:
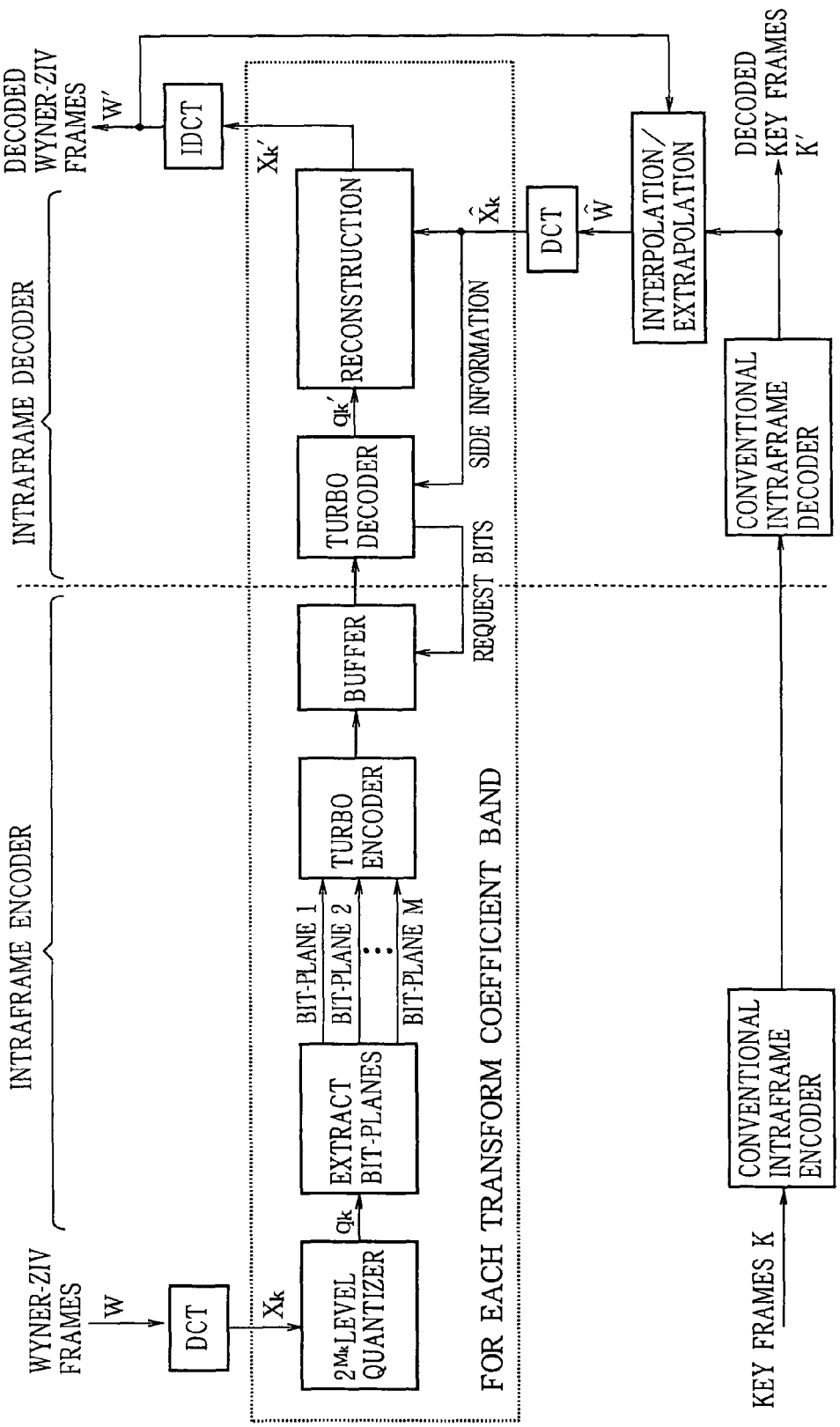
FIG. 1 is an explanatory diagram illustrating conventional distributed video coding and decoding.
Figure 2:
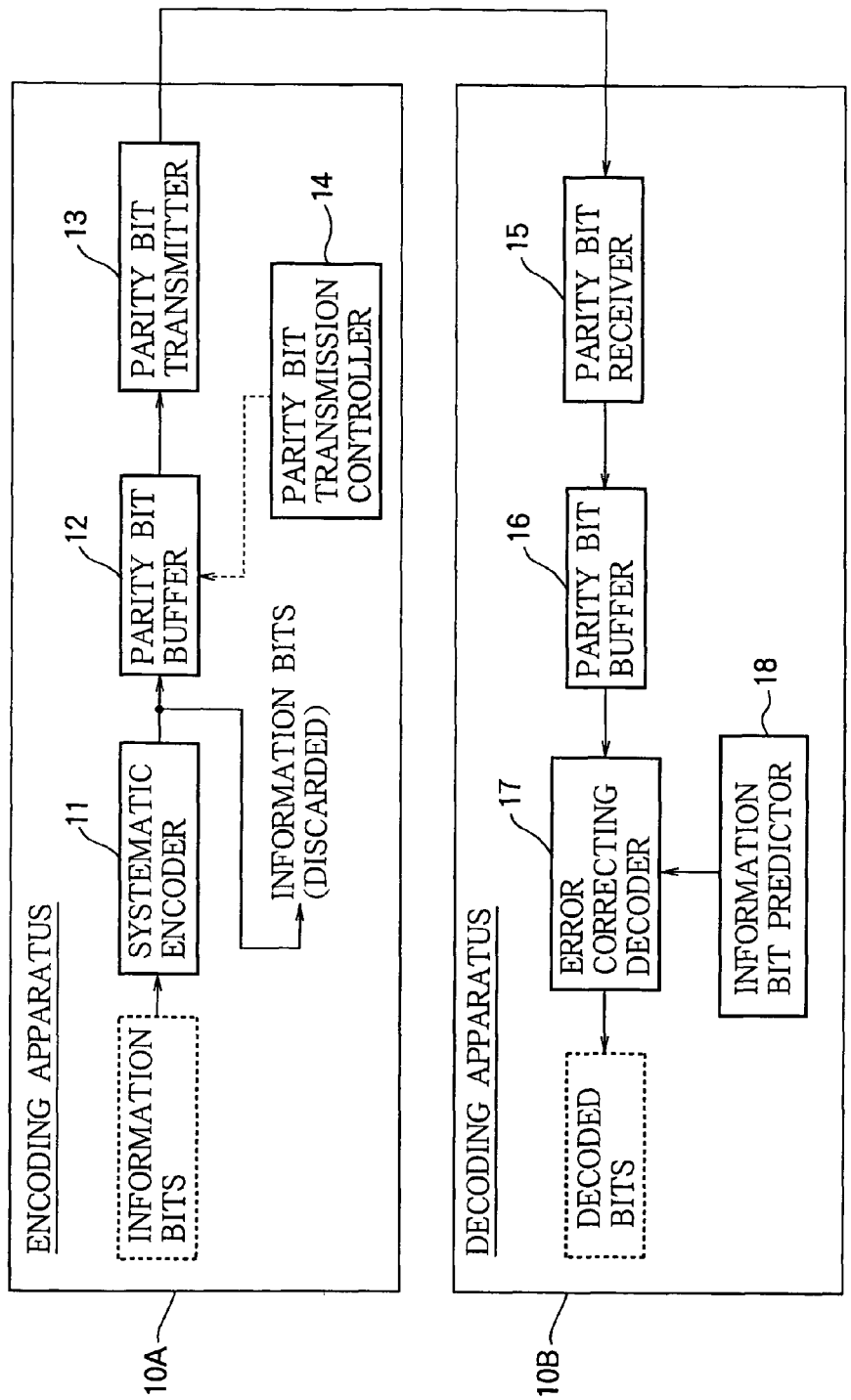
FIG. 2 is a block diagram illustrating a conventional coding system.

Embodiments of the invention will now be described with reference to the attached drawings, in which like elements are indicated by like reference characters. The embodiments show decoding systems that use the inventive techniques for distributed video decoding of image data. The systems receive coded data for key frames and Wyner-Ziv frames, and output decoded image data.

First Embodiment

Figure 5:
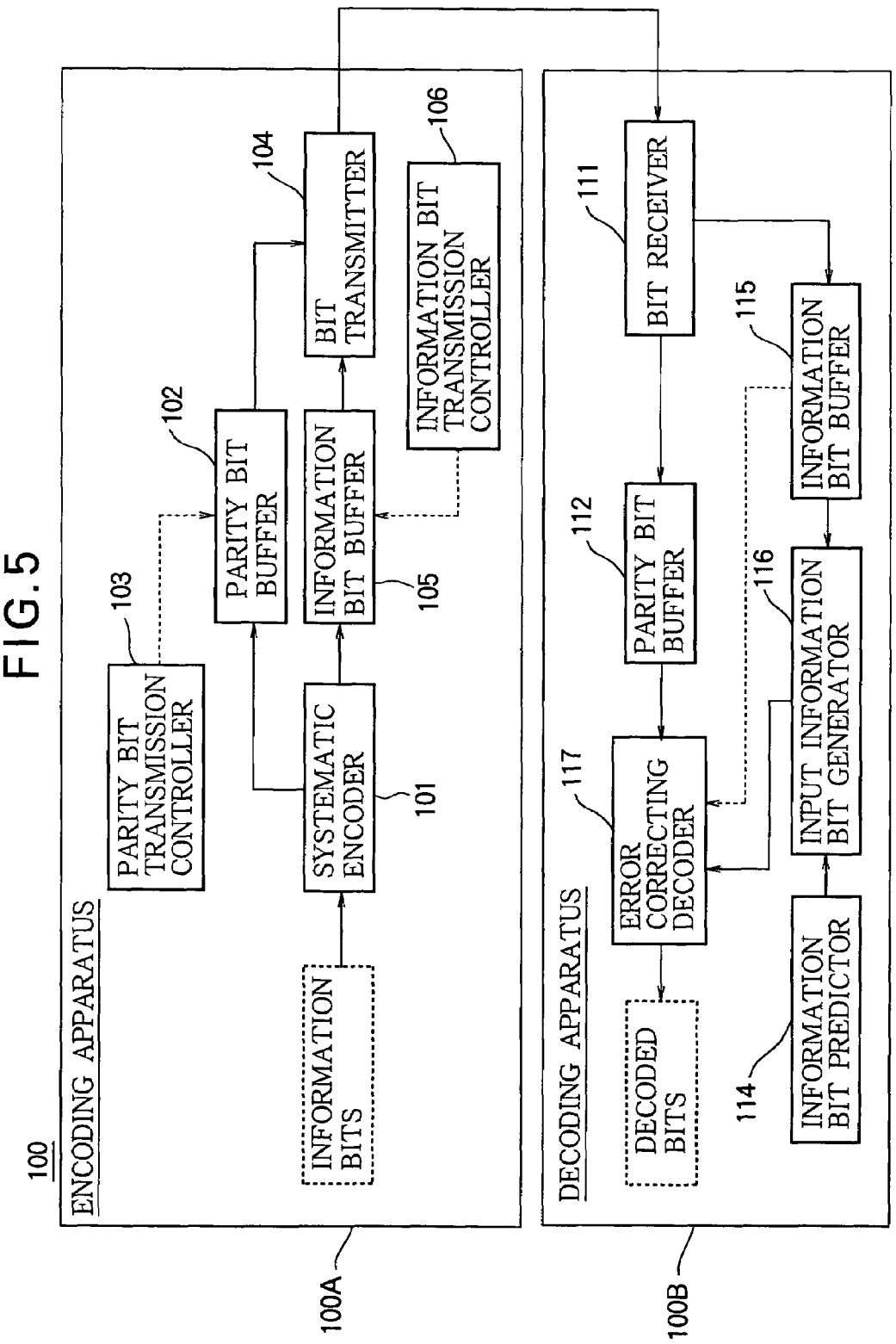
FIG. 5 is a block diagram illustrating a coding system in a first embodiment of the invention.

Referring to FIG. 5, the first embodiment is a coding system 100 comprising an encoding apparatus 100A and a decoding apparatus 100B. The encoding apparatus 100A encodes input information and sends encoded data to the decoding apparatus 100B. The decoding apparatus 100B receives and decodes the encoded data.

The encoding apparatus 100A comprises a systematic encoder 101 for coding input information to generate information bits and parity bits, a parity bit buffer 102 for storing the parity bits generated by the systematic encoder 101, an information bit buffer 105 for storing the information bits generated by the systematic encoder 101, a bit transmitter 104 for transmitting the information bits and parity bits selectively, a parity bit transmission controller 103 for controlling the transmission of parity bits by the bit transmitter 104, and an information bit transmission controller 106 for controlling the transmission of information bits by the bit transmitter 104.

The decoding apparatus 100B comprises a bit receiver 111 for receiving information bits and parity bits from the encoding apparatus 100A, a parity bit buffer 112 for storing the parity bits received by the bit receiver 111, an information bit buffer 115 for storing the information bits received by the bit receiver 111, an information bit predictor 114 for predicting the information bits, an input information generator 116 for generating input information bits from the bits predicted by the information bit predictor 114 and the bits output from the information bit buffer 115, and an error correcting decoder 117 for carrying out an error-correcting decoding process on the input information bits generated by the input information generator 116 and the parity bits stored in the parity bit buffer 112.

The two main elements in FIG. 5 are interconnected as follows. The encoding apparatus 200A has an output unit (the bit transmitter 104 and controllers 103, 106) for selectively transmitting information bits and parity bits to the decoding apparatus 200B. The output unit is connected to the decoding apparatus 100B through a communication channel or the like, and the data output from the output unit are supplied to the decoding apparatus 100B. The decoding apparatus 100B has an input unit (the bit receiver 111) for input of data received from the encoding apparatus 100A. The input unit is connected to the encoding apparatus 100A through the above-mentioned communication channel or the like and receives the encoded data output from the encoding apparatus 100A.

The elements of the encoding apparatus 100A are interconnected as follows. The input and output units referred to in the following description are not explicitly shown in the drawings.

The systematic encoder 101 includes output units for sending the information bits to the information bit buffer 105 and the parity bits to the parity bit buffer 102.

The parity bit buffer 102 includes an input unit for receiving the parity bits generated by the systematic encoder 101, an input unit for receiving a control signal output from the parity bit transmission controller 103, and an output unit for sending the parity bits specified by the parity bit transmission controller 103 to the bit transmitter 104.

The parity bit transmission controller 103 includes an output unit for sending control signals to the parity bit buffer 102.

The information bit buffer 105 includes an input unit for receiving the information bits generated (or simply passed through) by the systematic encoder 101, an input unit for receiving control signals from the information bit transmission controller 106, and an output unit for sending the information bits specified by the information bit transmission controller 106 to the bit transmitter 104.

The information bit transmission controller 106 includes an output unit for sending a control signal to the information bit buffer 105.

The bit transmitter 104 includes input units for receiving the parity bits output from the parity bit buffer 102 and the information bits output from the information bit buffer 105, and an output unit for transmitting the bits to the decoding apparatus 100B.

The elements of the decoding apparatus 100B are interconnected as follows. The input and output units referred to in the following description are not explicitly shown in the drawings.

The bit receiver 111 includes an input unit for receiving data transmitted by the encoding apparatus 100A, an output unit for output of the received parity bits to the parity bit buffer 112, and another output unit for output of the received information bits to the information bit buffer 115.

The parity bit buffer 112 includes an input unit for input of the parity bits received from the bit receiver 111 and an output unit for output of the stored parity bits to the error correcting decoder 117.

The information bit buffer 115 includes an input unit for input of the information bits received from the bit receiver 111, an output unit for output of stored information bits to the input information generator 116, and another output unit for output of information indicating what information bits have been received to the error correcting decoder 117.

The information bit predictor 114 includes an output unit for output of predicted information bits to the input information generator 116.

The input information generator 116 includes input units for receiving the information bits output from the information bit buffer 115 and the predicted information bits output from the information bit predictor 114, and an output unit for output of generated information bits to the error correcting decoder 117.

The error correcting decoder 117 includes an input unit for receiving the generated information bits output from the input information generator 116, another input unit for receiving the parity bits output from the parity bit buffer 112, and an input unit for receiving information from the information bit buffer 115 indicating what information bits it has received.

Figure 6:
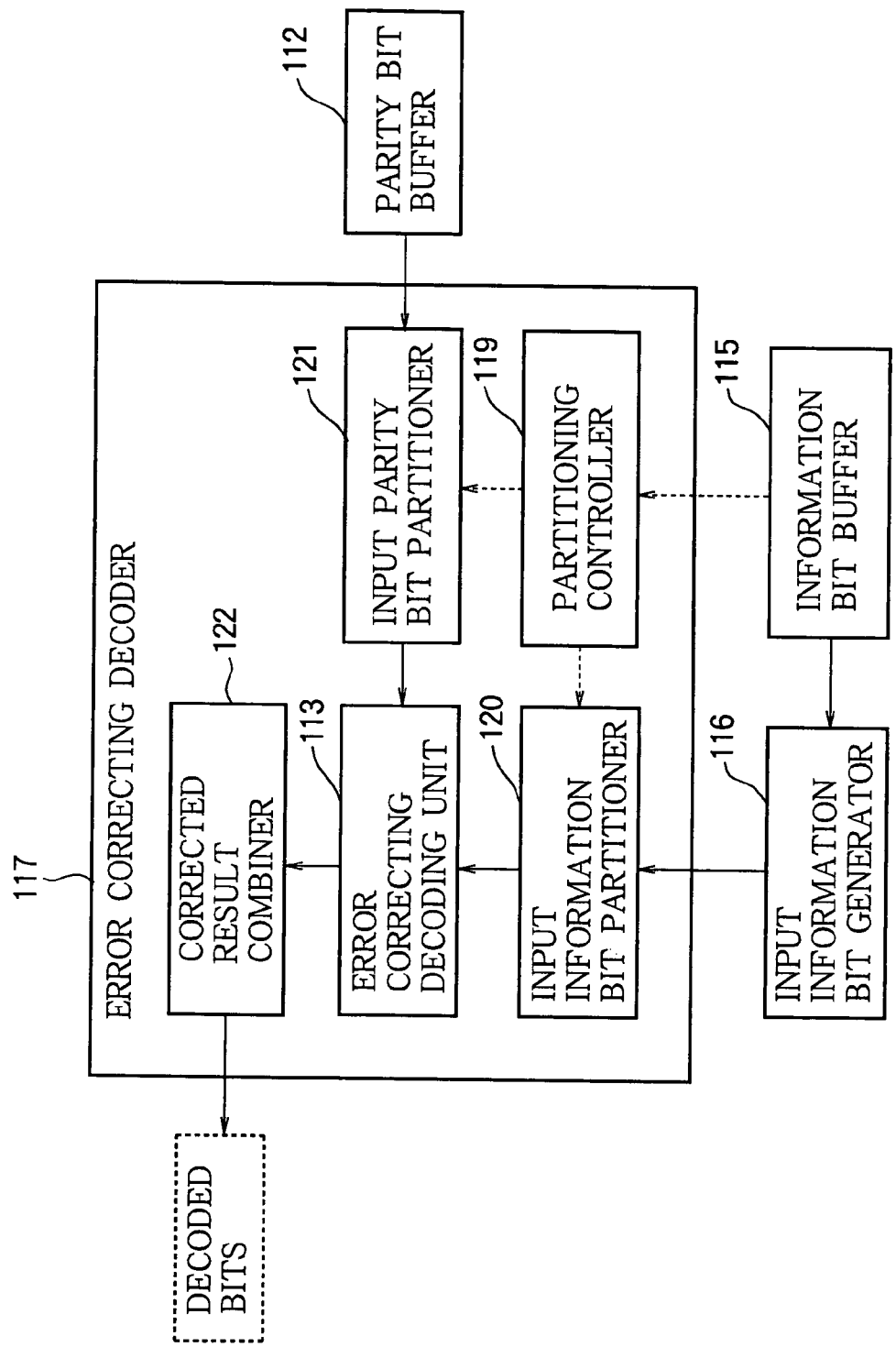
FIG. 6 is a block diagram illustrating the internal structure of the error correcting decoder in the first embodiment.

FIG. 6 is a block diagram illustrating the internal structure of the error correcting decoder 117 in the decoding apparatus 100B. The error correcting decoder 117 includes a partitioning controller 119, an input information bit partitioner 120, an input parity bit partitioner 121, a corrected result combiner 122, and an error correcting decoding unit 113.

The partitioning controller 119 receives information from the information bit buffer 115, outputs part of the information to the input information bit partitioner 120, and outputs another part of the information to the input parity bit partitioner 121.

The input information bit partitioner 120 receives information from the partitioning controller 119, takes the necessary information bits from the input information generator 116 in accordance with the received information, and outputs these information bits to the error correcting decoding unit 113.

The input parity bit partitioner 121 receives information from the partitioning controller 119, takes the necessary parity bits from the parity bit buffer 112 in accordance with the received information, and outputs these parity bits to the error correcting decoding unit 113.

The error correcting decoding unit 113 receives information bits from the input information bit partitioner 120, receives parity bits from the input parity bit partitioner 121, and outputs decoded data to the corrected result combiner 122.

The corrected result combiner 122 receives decoded data from the error correcting decoding unit 113 one partition at a time, combines the partitions, and outputs the combined result as decoded bits.

Figure 7:
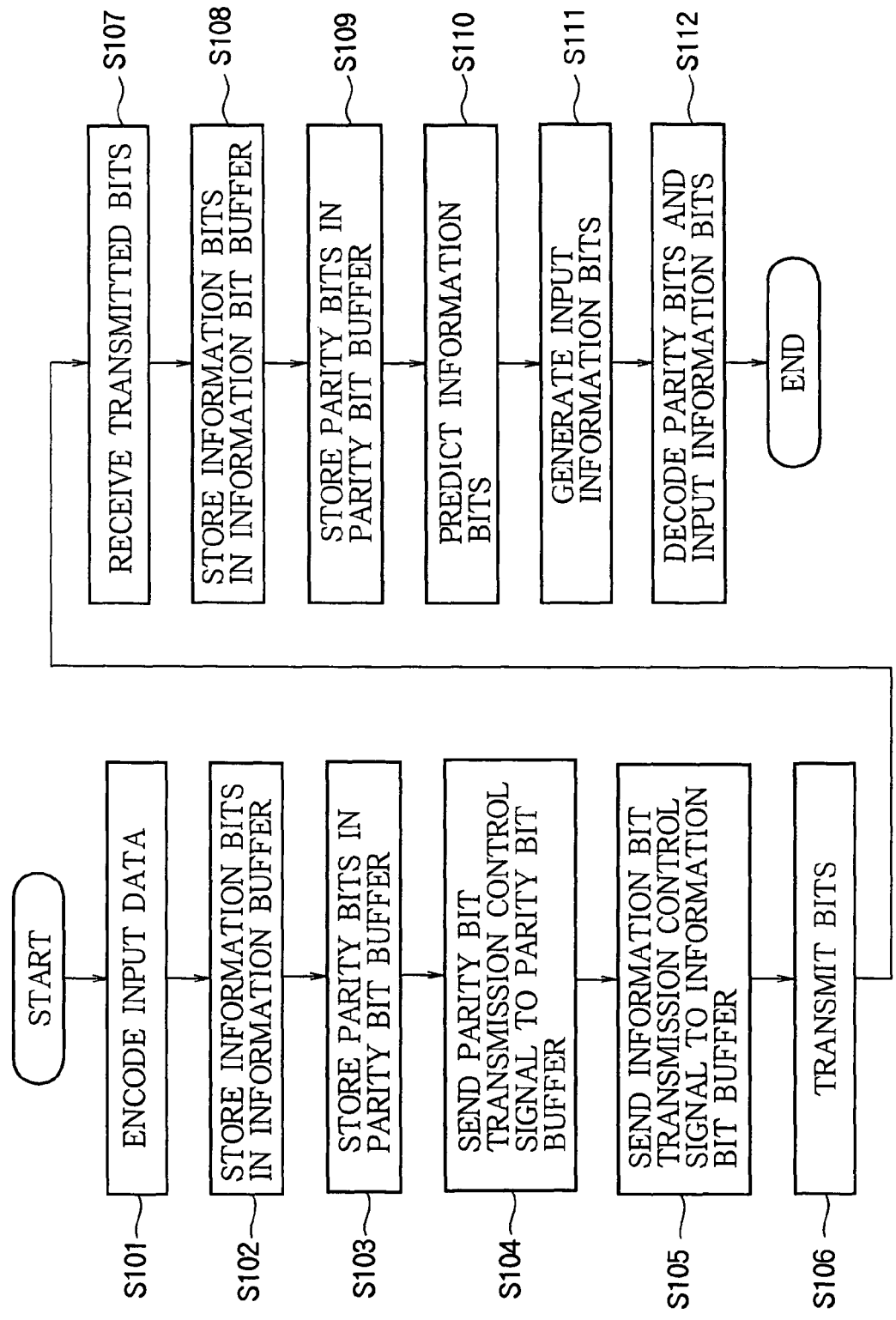
FIG. 7 is a flowchart illustrating the operation of the coding system in the first embodiment.

The operation of the coding system 100 in the first embodiment will be described with reference to the flowchart in FIG. 7.

When the data to be encoded (information bits) are input, the systematic encoder 101 encodes the data and generates information bits and parity bits (step S101). The systematic code employed by the systematic encoder 101 makes a clear distinction between information bits, which represent the input data, and parity bits, which provide redundant information for detecting and correcting errors in the information bits. A convolutional encoder or a turbo encoder may be used, for example.

The information bits generated by the systematic encoder 101 are stored in the information bit buffer 105 (step S102).

The parity bits generated by the systematic encoder 101 are stored in the parity bit buffer 102 (step S103).

The parity bit transmission controller 103 sends the parity bit buffer 102 control signals that control parity bit transmission. These signals determine the parity bit transmission method, the parity bits to be transmitted, and so on in accordance with a predetermined table or the like (step S104). This table or the like may be similar to the puncturing tables generally used for the puncturing of parity bits. The table may designate the transmission of one out of every eight parity bits, for example. The parity bit buffer 102 outputs the designated parity bits to the bit transmitter 104.

The information bit transmission controller 106 sends the information bit buffer 105 control signals that control information bit transmission by determining the information bit transmission method, the information bits to be transmitted, and so on in accordance with another predetermined table or the like (step S105). The information bit buffer 105 outputs information bits to the bit transmitter 104 under control of the information bit transmission controller 106.

The information bit transmission controller 106 uses a control scheme that enables the decoding apparatus 100B to identify the state of the systematic encoder 101 unequivocally at certain intervals. The length of these intervals depends on the image format and the processing resources of the decoder. For example, to allow the encoding apparatus 100A to identify the state at intervals of 177×144 pixels, corresponding to one frame in the QCIF image format, a series of consecutive information bits may be transmitted at intervals of this number of pixels. The length of the series of information bits depends on the structure of the systematic encoder 101.

If a CIF image is transmitted to a decoding apparatus designed to decode QCIF images by a MAP decoding process, each frame may be divided into four equal parts and a series of information bits of the length necessary to identify the state of the encoder may be transmitted at the beginning of each of the four parts. This scheme enables the trellis diagram for each part to be anchored at known starting and/or ending states, so that a MAP decoder for QCIF images can also decode CIF images.

Similarly, if the decoding apparatus 100B has a plurality of MAP decoders that operate concurrently, the data for a transmitted frame or other unit may be divided at arbitrary points into parts that can be decoded in parallel by the MAP decoders, and a series of information bits of the length necessary to identify the state of the encoder may be transmitted at each of these points. If there are two MAP decoders, for example, the data may be divided into two parts and a sequence of information bits may be transmitted at the dividing point between the two parts so that the trellis diagrams converge to a single state at the dividing point.

The designated parity bits from the parity bit buffer 102 and information bits from the information bit buffer 105 are provided to the bit transmitter 104, which transmits the provided bits (step S106).

During intervals between the identifiable points, the bit data transmitted by the bit transmitter 104 are insufficient for identification of the state of the systematic encoder 101. For example, during these intervals only parity bits may be transmitted, and the transmission may be punctured so that only some of the parity bits are transmitted.

The bits are transmitted from the encoding apparatus 100A through a communication channel or the like and are received by the bit receiver 111 in the decoding apparatus 100B (step S107).

The information bits received by the bit receiver 111 are stored in the information bit buffer 115 (step S108).

The parity bits received by the bit receiver 111 are stored in the parity bit buffer 112 (step S109).

The information bit predictor 114 predicts the information bits generated by the encoding apparatus 100A (step S110) by using data decoded before. The information bits of a video image frame can be predicted from a preceding frame or by interpolation between preceding and following frames. The information bits of a sound waveform are predicted from past waveform information by detecting short-term periodicities by autocorrelation processing and by detecting the envelope of the waveform.

The input information generator 116 generates information bits for input to the error correcting decoder 117 from the information bits predicted by the information bit predictor 114 and the information bits stored in the information bit buffer 115 (step S111). The input information generator 116 may generate the input information bits by overwriting the stored information bits on the predicted information bits.

The input information bits generated by the input information generator 116, the parity bits stored in the parity bit buffer 112, and information indicating which information bits have been stored in the information bit buffer 115 are input to the error correcting decoder 117, where an error-correcting decoding process is carried out (step S112).

The decoding process in the error correcting decoder 117 may use the MAP algorithm, for example, to obtain a likelihood that each bit is 0 or 1, or may employ a turbo decoding process, in which different convolutional decoders repeatedly supply their results to each other as a-priori probabilities.

FIG. 8 is a flowchart illustrating the operation of the error correcting decoder 117 in the decoding apparatus 100B in the first embodiment.

The information indicating which information bits were stored in the information bit buffer 115 is input to the partitioning controller 119 (step S1701). This information may specify the positions of the received information bits, for example, and is used to determine the identifiable points at which the state of the encoder can be identified.

The partitioning controller 119 uses the information received from the information bit buffer 115 to decide where to partition the decoding process and supplies information specifying the dividing points to the input information bit partitioner 120 and the input parity bit partitioner 121 (step S1702). Depending on implementation details of the decoding process, it may be sufficient to supply the dividing point information to just one of the two partitioners 120, 121.

For each data partition, as defined by the dividing point information output from the partitioning controller 119, the input information bit partitioner 120 obtains the input information bits belonging to the partition from the input information generator 116 (step S1703), and the input parity bit partitioner 121 obtains the parity bits belonging to the partition from the parity bit buffer 112 (step S1704).

For each data partition, the information bits obtained by the input information bit partitioner 120 and the parity bits obtained by the input parity bit partitioner 121 are input to the error correcting decoding unit 113 (step S1705) and decoded independently from the data in other partitions. The error correcting decoding unit 113 may use the MAP decoding algorithm described by Sklar or the sliding window algorithm described by Viterbi et al.

In step S1706, the error correcting decoding unit 113 decides whether the decoding of all partitions has been completed. If not, the decoding process returns to step S1702 to process the next partition.

In the error correcting decoder 117, the error correcting decoding unit 113 outputs the decoded data for each partition to the corrected result combiner 122. When the decoding of all partitions has been completed, the decoded data are combined and output (step S1707).

Figure 3:
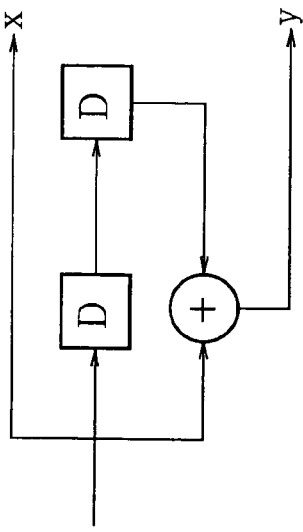
FIG. 3 illustrates the structure of a feedforward convolutional encoder.
Figure 4:
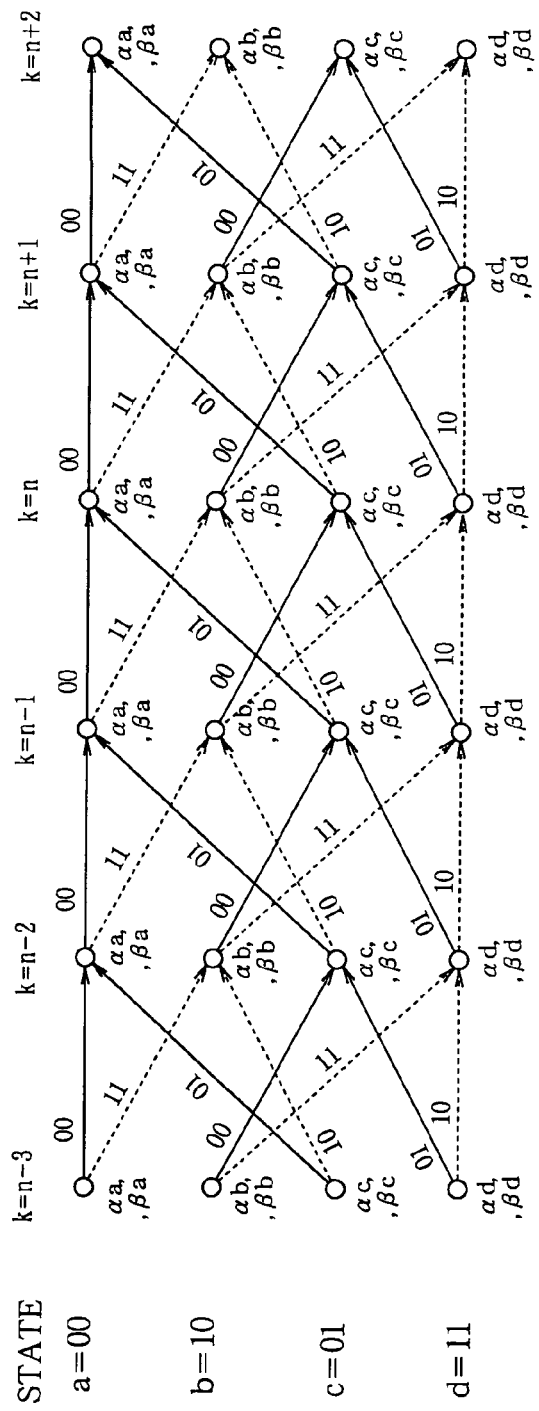
FIG. 4 shows an exemplary feedforward trellis diagram.

The operation of the error correcting decoder 117 in the decoding apparatus 100B will be described with reference to FIGS. 3, 4, 9, 10A, and 10B. In the trellis diagrams in FIGS. 9, 10A, and 10B, there is an identifiable point (k=n) at which the encoder state is known to have been state a (00). At this point, accordingly, the trellis diagram converges to a single state. The information needed to make the trellis diagram converge in this way depends on the type of encoder used. If a feedforward convolutional encoder of the type shown in FIG. 3 is used, for example, a consecutive sequence of information bits provides sufficient bit data to make the trellis diagram converge. If a feedback convolutional encoder is used, a consecutive sequence of pairs of information bits and parity bits provides sufficient bit data to make the trellis diagram converge.

It will be assumed that the systematic encoder 101 includes the feedforward convolutional encoder in FIG. 3 and that the error correcting decoder 117 uses the MAP decoding algorithm described by Sklar. Forward branch metric values α are calculated from left to right and backward branch metric values β are calculated from right to left as explained above in relation to FIG. 4.

To identify the state at time k=n, the encoding apparatus 100A sends a sequence of two information bits corresponding to the transition from time n−2 to time n−1 and for the transition from time n−1 to time n. Both information bits have '0' values and are received correctly by the decoding apparatus 100B.

Since the decoding apparatus knows that the information bit values that caused the two transitions between time n−2 and time n cannot be '1', the corresponding calculations become unnecessary. This is indicated by the decreased number of trellis lines between time n−2 and time n in FIG. 9, as compared with FIG. 4. The state at time n must be state a, and the state at time n−1 may be either a or c.

Figures 10A, 10B:
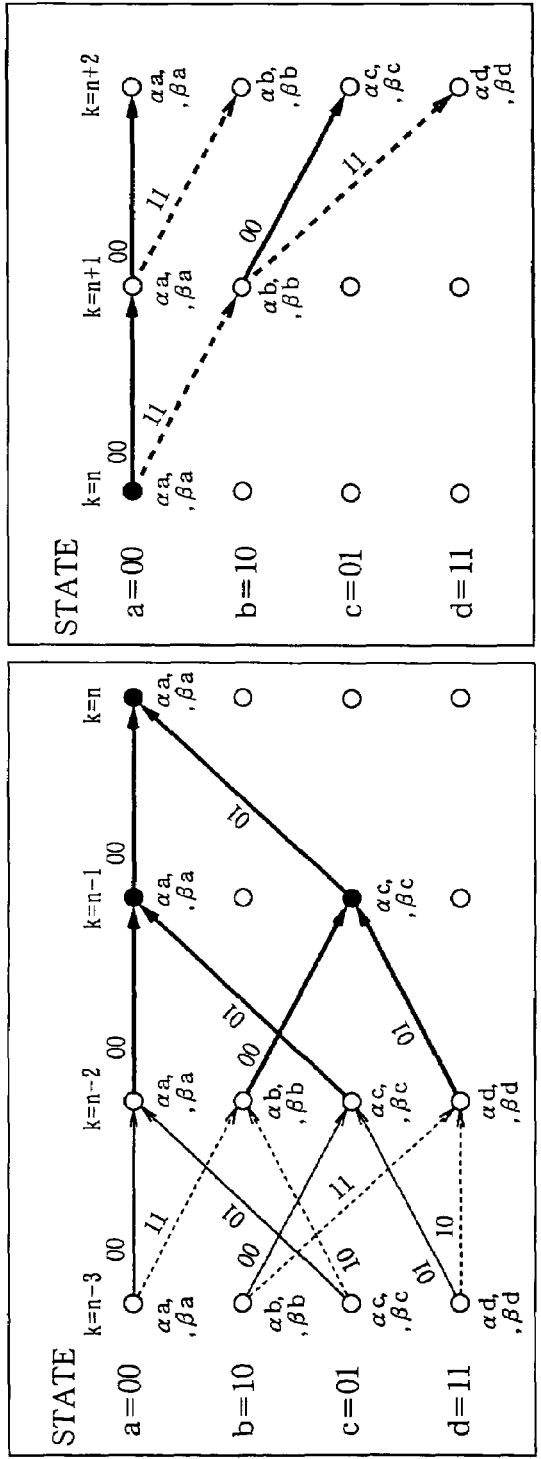
FIGS. 10A and 10B show the trellis diagram in FIG. 9 divided into two parts that can be independently decoded.

The trellis diagram in FIG. 9 can accordingly be partitioned at time n as shown in FIGS. 10A and 10B, and the part before time n (FIG. 10A) and the part after time n (FIG. 10B) can be decoded independently. The two decoding processes can be performed one after the other or concurrently, in parallel.

Figure 11:
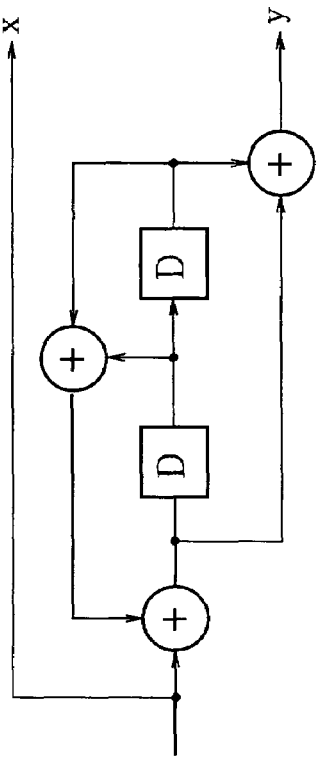
FIG. 11 illustrates the structure of a feedback convolutional encoder.
Figure 12:
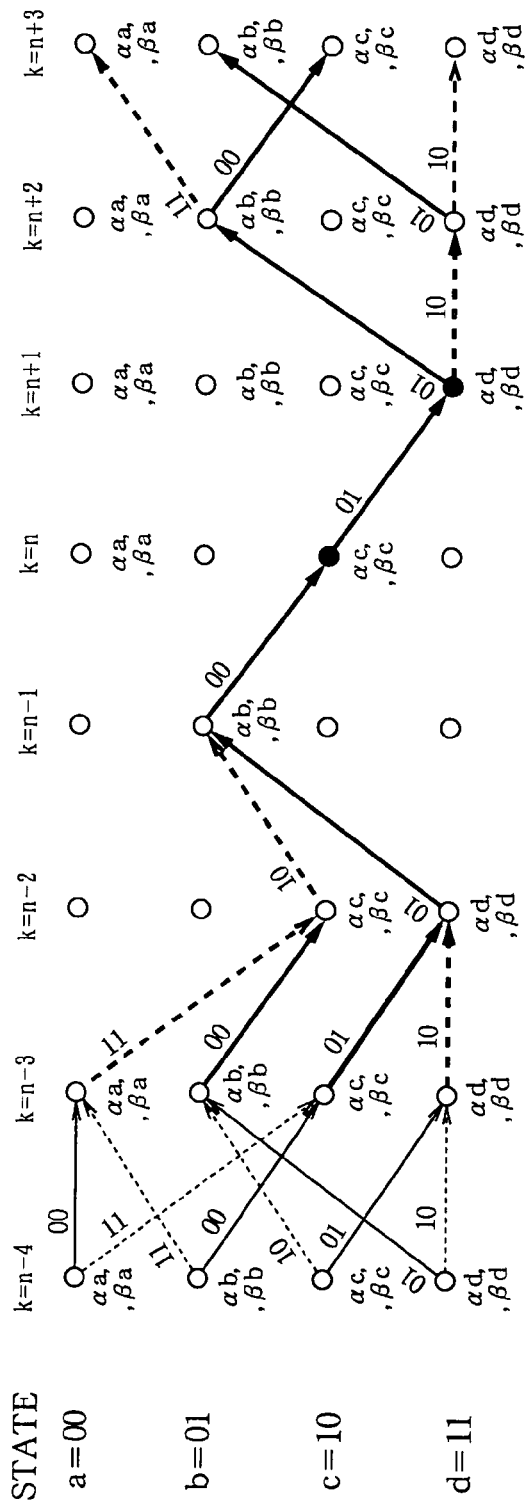
FIG. 12 shows an exemplary feedback trellis diagram for the decoding apparatus in the first embodiment.

The operation of the error correcting decoder 117 when a feedback convolutional encoder is used will be described through a further example with reference to FIGS. 11, 12, 13A, and 13B. FIG. 11 illustrates the structure of the feedback convolutional encoder used in this example to generate information bits (x) and parity bits (y). FIG. 12 shows an exemplary trellis diagram illustrating the decoding process.

To identify the state at time n, the transmitting apparatus 101A transmits two consecutive information bits corresponding to the two transitions from time n−1 to time n and from time n to time n+1. In the example shown in FIG. 12, an information bit value of '0' and a parity bit value of '0' are received correctly for the transition from time n−1 to time n, and an information bit value of '0' and a parity bit value of '1' are received correctly for the transition from time n to time n+1. As a result, the state at time n−1 is limited to b, the state at time n is limited to c, and the state at time n+1 is limited to d. The branch calculations made unnecessary by these identifications have been removed from FIG. 12, making the trellis diagram converge to a single state as in FIG. 9.

Figure 13B:
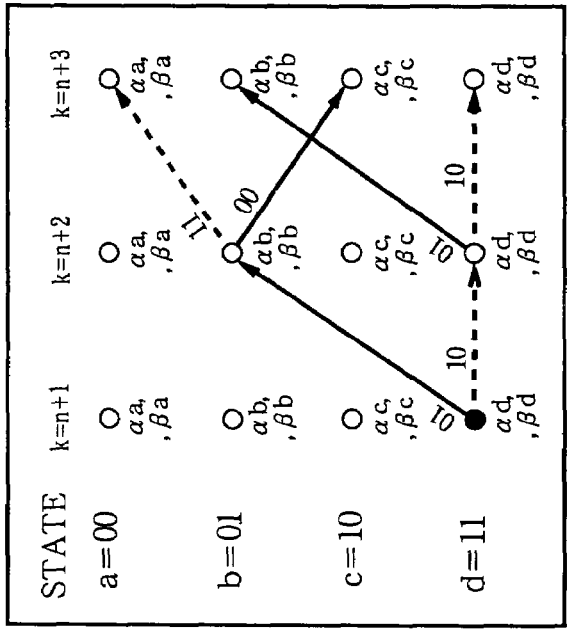
FIGS. 13A and 13B show the trellis diagram in FIG. 12 divided into two parts that can be independently decoded.
Figure 13A:
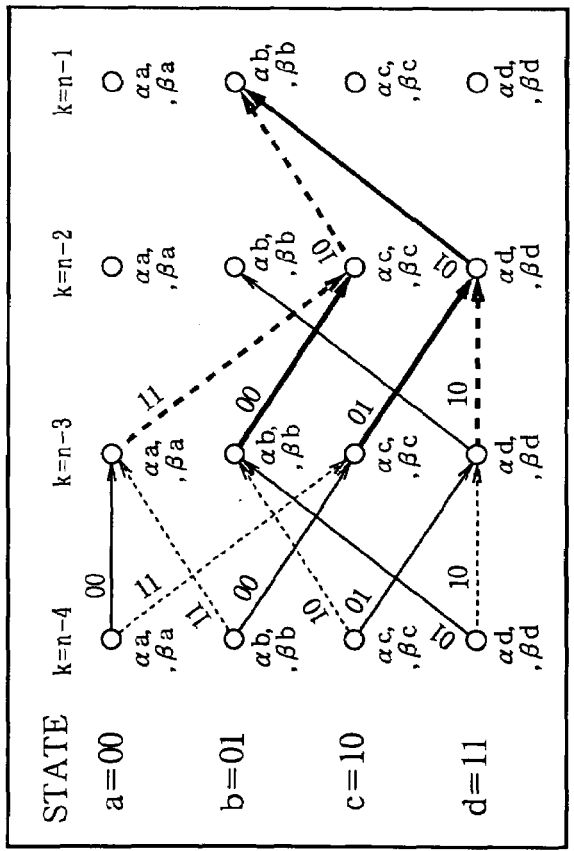

The trellis diagram in FIG. 12 can accordingly be partitioned as shown in FIGS. 13A and 13B, and the part up to time n−1 (FIG. 13A) and the part following time n+1 (FIG. 13B) can be decoded independently. The two decoding processes can be performed concurrently or one after the other.

In the first embodiment, a MAP decoder of a single type can decode data for different image formats. When the image format is changed, it is only necessary to transmit information bits at appropriate dividing points so that the data can be divided into partitions of the size that the decoding apparatus can process. The data partitions can be processed serially by a single MAP decoder or in parallel by a plurality of identical MAP decoders. In either case, no extra circuitry is needed to decode images in different formats. In a parallel processing environment, the parallel multiplicity (the number of MAP decoders operating concurrently) can be easily changed to meet changing requirements. In addition, the transmission of additional bits at the dividing points provides a higher error correcting capability than obtained by conventional parallel processing as disclosed by Viterbi et al.

A further advantage of the first embodiment is that since the data can be partitioned into units of a small number of symbols each, the memory space needed for storing branch metric values and other such data can be reduced.

Second Embodiment

Next, a second embodiment of the invention will be described with reference to the drawings.

Figure 14:
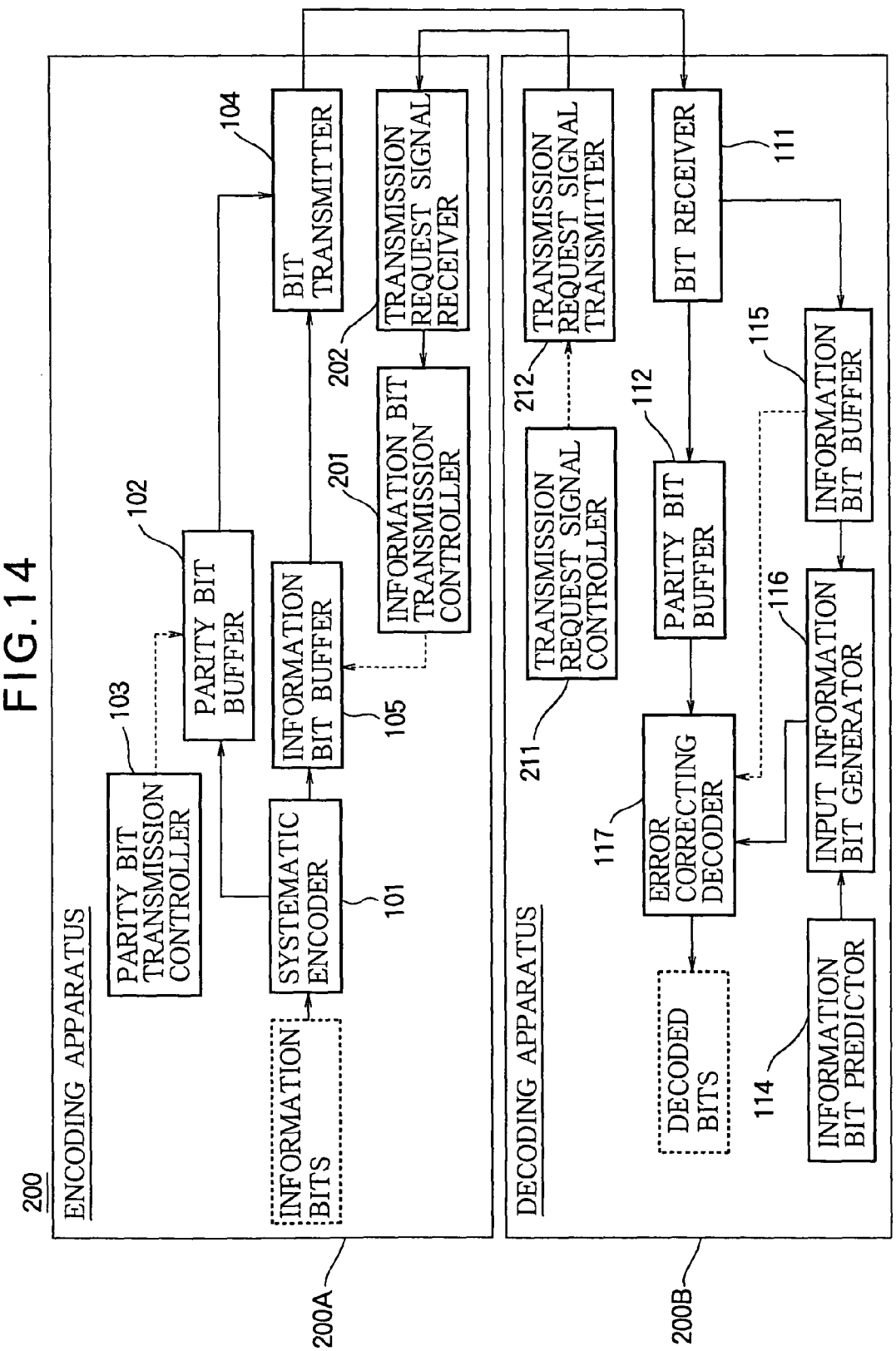
FIG. 14 is a block diagram illustrating the coding system in a second embodiment.

Referring to FIG. 14, the second embodiment is a coding system 200 comprising an encoding apparatus 200A and a decoding apparatus 200B. The encoding apparatus 200A encodes input information and sends encoded data to the decoding apparatus 200B. The decoding apparatus 100B informs the encoding apparatus 200A of the encoded data it requires, and receives and decodes the encoded data.

The encoding apparatus 200A comprises a systematic encoder 101 for coding input information to generate information bits and parity bits, a parity bit buffer 102 for storing the parity bits generated by the systematic encoder 101, an information bit buffer 105 for storing the information bits generated by the systematic encoder 101, a bit transmitter 104 for transmitting the information bits and parity bits selectively, a parity bit transmission controller 103 for controlling the transmission of parity bits by the bit transmitter 104, a transmission request signal receiver 202 for receiving a transmission request signal from the decoding apparatus 200B, and an information bit transmission controller 201 for controlling the transmission of information bits according to the transmission request signal received by the transmission request signal receiver 202.

The decoding apparatus 200B comprises a bit receiver 111 for receiving information bits and parity bits from the transmitter, a parity bit buffer 112 for storing the parity bits received by the bit receiver 111, an information bit buffer 115 for storing the information bits received by the bit receiver 111, an information bit predictor 114 for predicting the information bits, an input information generator 116 for generating input information bits from the bits predicted by the information bit predictor 114 and the bits output from the information bit buffer 115, an error correcting decoder 117 for carrying out an error-correcting decoding process on the input information bits generated by the input information generator 116 and the parity bits stored in the parity bit buffer 112, a transmission request signal transmitter 212 for sending a transmission request signal to the encoding apparatus 200A, and a transmission request signal controller 211 for controlling the operation of the transmission request signal transmitter 212.

The two main elements in FIG. 14 are interconnected as in the first embodiment, except that the decoding apparatus 200B has an output unit (the transmission request signal transmitter 212) for output of transmission request signals, the encoding apparatus 200A has an input unit (the transmission request signal receiver 202) for input of transmission request signals, and these two units are interconnected through a communication channel or the like.

The elements of the encoding apparatus 200A are interconnected as follows. The input and output units referred to in the following description are not explicitly shown in the drawings.

The systematic encoder 101 includes output units for sending the information bits to the information bit buffer 105 and the parity bits to the parity bit buffer 102.

The parity bit buffer 102 includes an input unit for receiving the parity bits generated by the systematic encoder 101, an input unit for receiving a control signal output from the parity bit transmission controller 103, and an output unit for sending the parity bits specified by the parity bit transmission controller 103 to the bit transmitter 104.

The parity bit transmission controller 103 includes an output unit for sending control signals to the parity bit buffer 102.

The information bit buffer 105 includes an input unit for input of the information bits generated (or simply passed through) by the systematic encoder 101, an input unit for input of the control signals received from the information bit transmission controller 201, and an output unit for output of the information bits specified by the information bit transmission controller 201 to the bit transmitter 104.

The information bit transmission controller 201 includes an input unit for input of request signals from the transmission request signal receiver 202 and an output unit for output of control signals to the information bit buffer 105.

The transmission request signal receiver 202 includes an input unit for input of transmission request signals from the decoding apparatus 200B and an output unit for output of these transmission request signals or related information as request signals to the information bit transmission controller 201.

The bit transmitter 104 includes input units for receiving the parity bits output from the parity bit buffer 102 and the information bits output from the information bit buffer 105, and an output unit for transmitting the received bits to the decoding apparatus 200B.

The elements of the decoding apparatus 200B are interconnected as follows. The input and output units referred to in the following description are not explicitly shown in the drawings.

The transmission request signal controller 211 includes an output unit for sending the transmission request signal transmitter 212 information specifying data to be requested from the encoding apparatus 200A.

The transmission request signal transmitter 212 includes an input unit for input of this information from the transmission request signal controller 211 and an output unit for output of a transmission request signal to the encoding apparatus 200A.

The bit receiver 111 includes an input unit for receiving data transmitted by the encoding apparatus 200A, an output unit for output of the received parity bits to the parity bit buffer 112, and another output unit for output of the received information bits to the information bit buffer 115.

The parity bit buffer 112 includes an input unit for input of the parity bits received from the bit receiver 111 and an output unit for sending the stored parity bits to the error correcting decoder 117.

The information bit buffer 115 includes an input unit for input of the information bits received from the bit receiver 111, an output unit for sending the stored information bits to the input information generator 116, and another output unit for sending information indicating what information bits have been received to the error correcting decoder 117.

The information bit predictor 114 includes an output unit for sending predicted information bits to the input information generator 116.

The input information generator 116 includes input units for receiving the information bits output from the information bit buffer 115 and the predicted information bits output from the information bit predictor 114, and an output unit for sending generated information bits to the error correcting decoder 117.

The error correcting decoder 117 includes an input unit for receiving the generated information bits output from the input information generator 116, another input unit for receiving the parity bits output from the parity bit buffer 112, and an input unit for receiving information from the information bit buffer 115 indicating what information bits have been received.

The internal structure of the error correcting decoder 117 is the same as in the first embodiment, shown in FIG. 6.

Figure 15:
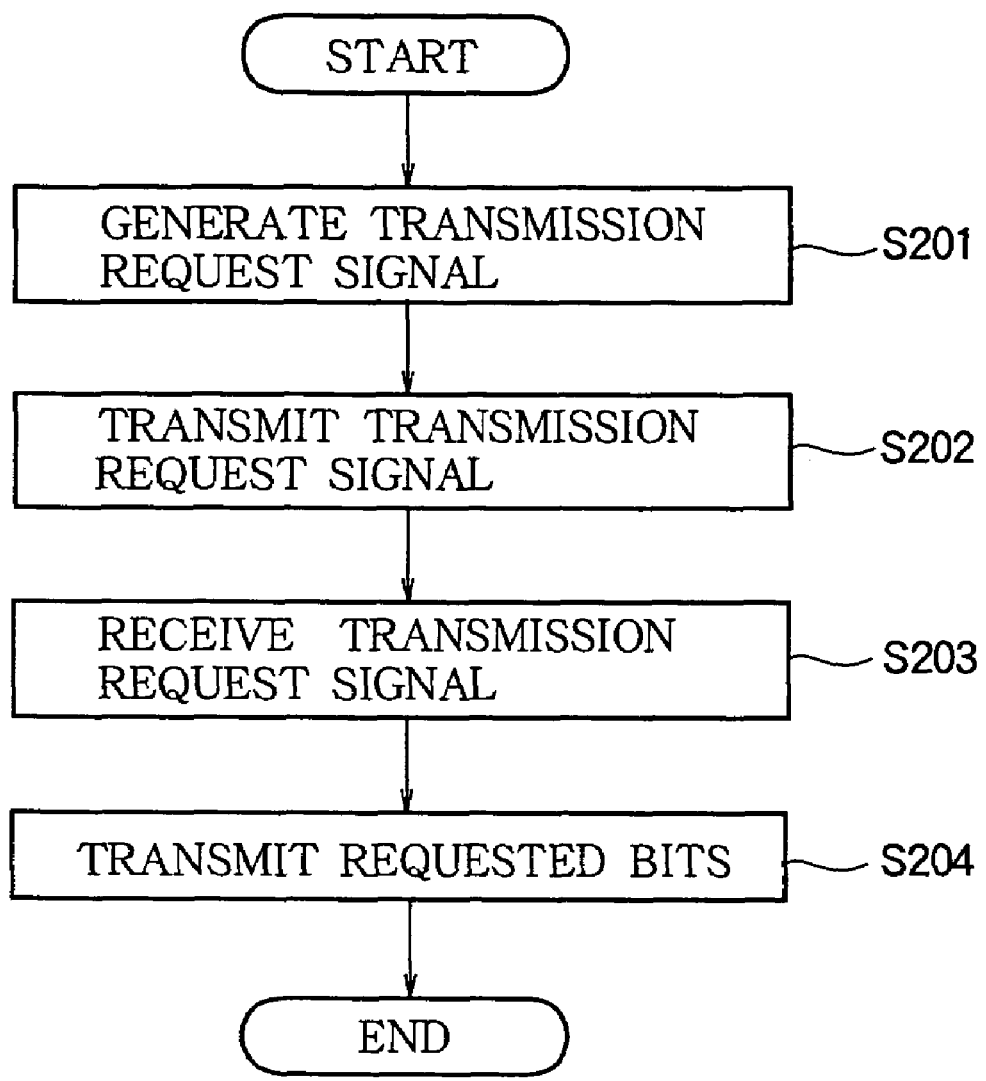
FIG. 15 is a flowchart illustrating the operation of the coding system in the second embodiment.

The second embodiment operates in the same way as the first embodiment except for additional operations performed by the information bit transmission controller 201 and transmission request signal receiver 202 in the encoding apparatus 200A and the transmission request signal controller 211 and transmission request signal transmitter 212 in the decoding apparatus 200B. Those elements have been added to control the output of bits from the information bit buffer 105 in the encoding apparatus 200A. These additional operations will be described with reference to the flowchart in FIG. 15.

The transmission request signal controller 211 generates information specifying a point at which the decoding apparatus 200B needs to be able to identify the state of the encoder in the encoding apparatus 200A, and sends this information to the transmission request signal transmitter 212 as a transmission request signal (step S201) Alternatively, the transmission request signal may describe the decoding resources of the decoding apparatus 200B, leaving the encoding apparatus 200A to select the points at which to provide the bit information necessary for identifying the encoder state.

Under control of the transmission request signal controller 211, the transmission request signal transmitter 212 sends the transmission request signal to the encoding apparatus 200A (step S202).

The transmission request signal receiver 202 in the encoding apparatus 200A receives the transmission request signal transmitted by the transmission request signal transmitter 212 in the decoding apparatus 200B (step S203).

The information bit transmission controller 201 analyzes the transmission request signal received by the transmission request signal receiver 202 and controls the information bit buffer 105 in accordance with the result of its analysis. The analysis may tell the transmission request signal receiver 202 that, for example, the decoding apparatus 200B has only a QCIF MAP decoder, or has a certain number of MAP decoders. By selecting the bits to be transmitted accordingly, the transmission request signal receiver 202 can arrange for the decoding trellis diagram to converge to a single state at dividing points separated by intervals of a length suitable for processing by the decoding resources of the decoding apparatus 200B. If this length changes because of a change in conditions at the decoding apparatus 200B, the transmission request signal receiver 202 can compensate for the change by changing the spacing between the dividing points.

This scheme provides the coding system 200 with the flexibility to cope with any sort of change. For example, the amount of data that a MAP decoder can process as a single unit may depend on the availability of memory space for storing the branch metrics and other information. If the decoding apparatus 200B is part of a personal computer, the optimal processing unit size may depend on the amount of free space in the personal computer's memory. A threshold scheme can be used to increase or decrease the intervals between dividing points according to the amount of free space. If the personal computer has a multi-core central processing unit and can use its multiple cores for parallel MAP decoding, the parallel multiplicity of the decoding process can be reduced when some of the cores have to be used for other processing. By informing the encoding apparatus 200A of the number of parallel decoders available, the decoding apparatus 200B can make maximum use of its computing resources.

Under control of the information bit transmission controller 201, the information bit buffer 105 outputs the information bits needed by the decoding apparatus 200B (step S204). The bit transmitter 104 preferably transmits these bits over an error-free channel to ensure that they will be received correctly. If the information bits are not received correctly, it becomes difficult to identify the corresponding encoder state so that the trellis diagram can be reduced to a single state.

Once the transmission request signal receiver 202 knows what information bits the decoding apparatus 200B requires, subsequent operations are the same as in the first embodiment.

In the preceding description of the operation of the second embodiment, the decoding apparatus 200B issues only transmission requests for information bits, but the decoding apparatus 200B may also request additional parity bits as necessary to achieve adequate error correction. Decoding apparatus that can request parity bits is well known in the art, and this operation can be easily combined with the requesting of information bits as described in the second embodiment.

The second embodiment provides the same effects as the first embodiment, but also enables decoding to be carried out with the optimal number of symbols per data partition, as specified by the decoding apparatus. The decoding process can therefore be controlled dynamically and flexibly, which is particularly important in a parallel processing environment.

VARIATIONS

As mentioned above, the present invention can be practiced with the sliding window algorithm instead of the MAP decoding algorithm.

If the decoding process is iterated in an interleaved manner, as in turbo encoding, the interleaving scheme may be taken into consideration in determining the amount of data, including information bits alone or both information bits and parity bits, that are needed to enable the decoding apparatus to identify the state of the encoder at an identifiable point.

The decoder in the first embodiment or second embodiment may specify the number or type of parity bits required and may request additional transmission of parity bits.

In the first embodiment, it is not necessary for the encoding and decoding apparatus to communicate through a communication channel. For example, the encoding apparatus may store encoded data on a recording medium such as a hard disk drive, and the decoding apparatus may read the encoded data from the hard disk drive.

In the decoding apparatus, the possible locations of dividing points need not be determined from information obtained from the information bit buffer 115 as in the first and second embodiments. The dividing points may be determined by use of information furnished by other means, such as a signal transmitted from the encoder.

The error-correcting decoding process carried out on a single data partition may be performed by either serial processing or parallel processing.

The data used to identify a state must be correct in the first and second embodiments. For communication over a non-error-free communication channel, the encoding apparatus may use an error-correcting code of sufficient strength to assure correct reception of the data.

Those skilled in the art will recognize that further variations are possible within the scope of the invention, which is defined in the appended claims.

What is claimed is:

1. An encoding apparatus comprising:
a systematic encoder for encoding input data to generate information bits and parity bits, the information bits representing the input data, the parity bits providing redundancy for error correction;
an information bit storage unit for storing the information bits generated by the systematic encoder;
a parity bit storage unit for storing the parity bits generated by the systematic encoder;
an information bit transmission controller for controlling selective transmission of the information bits stored in the information bit storage unit;
a parity bit transmission controller for controlling selective transmission of the parity bits stored in the parity bit storage unit; and
a bit transmitter for transmitting the information bits and/or the parity bits to a decoding apparatus under control of the information bit transmission controller and the parity bit transmission controller.

2. The encoding apparatus of claim 1, wherein:
the input data are supplied to the systematic encoder as a sequence if bits causing the systematic encoder to assume a corresponding sequence of states;
at certain identifiable points in the sequence of states, the information bit transmission controller and the parity bit transmission controller cause sufficient bit data to be transmitted to enable the decoding apparatus to identify the state of the systematic encoder without reference to preceding and following transmitted bit data; and
during intervals between the identifiable points, the bit data transmitted by the bit transmitter are insufficient for identification of the state of the systematic encoder.

3. The encoding apparatus of claim 2, wherein the sufficient bit data depend on the systematic encoder.

4. The encoding apparatus of claim 2, wherein the systematic encoder includes at least one feedforward convolutional encoder and the sufficient bit data include a consecutive sequence of information bits.

5. The encoding apparatus of claim 2, wherein the systematic encoder includes at least one feedback convolutional encoder and the sufficient bit data include a consecutive sequence of pairs of bits, each pair of bits including one information bit and one parity bit.

6. The encoding apparatus of claim 2, wherein the identifiable points are determined according to a length of data processed as an independent unit by the decoding apparatus.

7. The encoding apparatus of claim 2, wherein the identifiable points are determined according to an image format.

8. The encoding apparatus of claim 2, wherein the identifiable points are determined according to a number of parallel processors operating concurrently in the decoding apparatus.

9. The encoding apparatus of claim 1, further comprising a transmission request signal receiver for receiving a transmission request signal from the decoding apparatus, wherein the information bit transmission controller controls of the transmission of the information bits according to the transmission request signal.

10. The encoding apparatus of claim 1, wherein the bit transmitter encodes the transmitted bits with an error-correcting code enabling transmission errors to be completely corrected in the decoding apparatus.

11. A decoding apparatus comprising:
- a bit receiver for selectively receiving both information bits and parity bits generated by a systematic encoder in an encoding apparatus;
- an information bit storage unit for storing the information bits received by the bit receiver;
- a parity bit storage unit for storing the parity bits received by the bit receiver;
- an information bit predictor for generating predicted information bits;
- an input information bit generator for generating input information bits by combining the information bits stored in the information bit storage unit with the predicted information bits; and
- an error correcting decoder for dividing the information bits and the parity bits collectively into partitions separated by identifiable points at which the received information bits and parity bits identify a state of the systematic encoder, and decoding the parity bits and the input information bits in each partition separately.

12. The decoding apparatus of claim 11, wherein the error correcting decoder decodes the partitions one after another.

13. The decoding apparatus of claim 11, wherein the error correcting decoder decodes a plurality of the partitions concurrently.

14. The decoding apparatus of claim 11, further comprising:
- a transmission request controller for controlling transmission of a transmission request signal to the encoding apparatus; and
- a transmission request signal transmitter for transmitting the transmission request signal to the encoding apparatus.

15. The decoding apparatus of claim 14, wherein the transmission request signal specifies a size of the partitions.

16. The decoding apparatus of claim 14, wherein the transmission request signal specifies an image format.

17. The decoding apparatus of claim 14, wherein the transmission request signal specifies a multiplicity of parallel processing.

18. The decoding apparatus of claim 14, wherein the transmission request controller controls the transmission request signal according to available memory space.

19. A coding system including the encoding apparatus of claim 1 and a decoding apparatus, the decoding apparatus comprising:
- a bit receiver for selectively receiving the information bits and the parity bits transmitted by the encoding apparatus;
- an information bit storage unit for storing the information bits received by the bit receiver;
- a parity bit storage unit for storing the parity bits received by the bit receiver;
- an information bit predictor for generating predicted information bits;
- an input information bit generator for generating input information bits by combining the information bits stored in the information bit storage unit with the predicted information bits; and
- an error correcting decoder for dividing the information bits and the parity bits collectively into partitions separated by the identifiable points at which the state of the systematic encoder in the encoding apparatus is identified, and decoding the parity bits and the input information bits in each partition separately.

* * * * *